United States Patent [19]

Akhnoukh et al.

[11] Patent Number: 6,087,721
[45] Date of Patent: Jul. 11, 2000

[54] SEMICONDUCTOR DEVICE WITH A HIGH-FREQUENCY BIPOLAR TRANSISTOR ON AN INSULATING SUBSTRATE

[75] Inventors: Atef Akhnoukh; Petrus M. A. W. Moors, both of Eindhoven, Netherlands

[73] Assignee: U.S. Philips Corporation, New York, N.Y.

[21] Appl. No.: 08/963,647

[22] Filed: Nov. 3, 1997

[30] Foreign Application Priority Data

Nov. 5, 1996 [EP] European Pat. Off. ............. 96203079

[51] Int. Cl.[7] ........................ H01L 23/00; H01L 23/49; H01L 23/46; H01L 29/40
[52] U.S. Cl. ..................... 257/705; 257/579; 257/588; 257/378; 257/197; 257/728; 257/370; 257/776
[58] Field of Search .................... 257/728, 678, 257/584, 554, 587, 386, 378, 579, 712, 784, 197, 376, 588, 644, 700, 705, 776

[56] References Cited

U.S. PATENT DOCUMENTS

| | | | |
|---|---|---|---|
| 3,784,884 | 1/1974 | Zoroglu | 257/664 |
| 4,739,389 | 4/1988 | Goedbloed | 257/464 |
| 5,151,775 | 9/1992 | Hadwin | 257/629 |
| 5,161,000 | 11/1992 | Koga | 257/717 |
| 5,198,904 | 3/1993 | Ito et al. | 257/796 |
| 5,397,917 | 3/1995 | Ommen et al. | 257/698 |
| 5,399,906 | 3/1995 | Komuro | 257/705 |
| 5,455,448 | 10/1995 | Benjamin | 257/565 |
| 5,465,007 | 11/1995 | Ikeda et al. | 257/584 |
| 5,689,138 | 11/1997 | Dekker et al. | 257/728 |
| 5,986,324 | 11/1999 | Adlerstein et al. | 257/587 |

FOREIGN PATENT DOCUMENTS

| | | | |
|---|---|---|---|
| 0590804 | 4/1994 | European Pat. Off. | H01L 29/52 |
| 06260563 | 9/1994 | Japan | H01L 23/12 |
| 6-260563A | 9/1994 | Japan | H01L 23/12 |

Primary Examiner—Alexander O. Williams
Attorney, Agent, or Firm—F. Brice Faller

[57] ABSTRACT

A bipolar transistor (3) is provided with a first main surface (4) in contact with a conductive mounting surface (2), and with an opposed second main surface (12) having connection pads (5, 6, 40) for an emitter, base, and collector. The lateral dimensions of the conductive mounting surface (2) are practically equal to the dimensions of the first main surface (4) of the transistor (3), and may thus be relatively small. The high-frequency properties of the transistor (3) are strongly determined by the size of the conductive mounting surface (2), which through an insulating substrate (1) forms a parasitic capacitance with a conductive ground surface (18), which capacitance is connected to the transistor (3). This parasitic capacitance is very important especially for high-frequency applications. Furthermore, the bonding wires (E, B) for the connection pads of emitter and base are shorter than in the prior art because they need not pass over a relatively large conductive mounting surface (2). Shorter bonding wires provide a lower self-inductance and resistance, which benefits the high-frequency properties and the possibility of supplying more electric power.

5 Claims, 3 Drawing Sheets

SEMICONDUCTOR DEVICE WITH A HIGH-FREQUENCY BIPOLAR TRANSISTOR ON AN INSULATING SUBSTRATE

BACKGROUND OF THE INVENTION

The invention relates to a semiconductor device provided with an insulating substrate and a conductive mounting surface, said insulating substrate being provided on a conductive ground surface. A bipolar transistor is provided on the mounting surface with a first main surface of the transistor in contact with the mounting surface, and the transistor is provided with connection pads for an emitter, base, and collector.

Such a device is particularly suitable for high-frequency applications, especially for modules provided with transmitter transistors. Such modules comprise an insulating substrate, for example made from a ceramic material, on which conductive mounting surfaces are provided with components thereon such as transistors, diodes, resistors, capacitors, etc. Such semiconductor devices are also known as thin or thick film circuits. The insulating substrates are mounted against a conductive ground surface, for example a heat sink, printed circuit board, screening, or housing.

A device of the kind mentioned in the opening paragraph is known from the English abstract of Japanese Patent Application no. 6-260563. The transistor in this known device is soldered to the conductive mounting surface with its first main surface, which at the same time serves as a connection surface for the collector, the conductive mounting surface thus acting as the collector connection of the transistor. The conductive mounting surface is for this purpose connected to further components by means of a bonding wire. To prevent flowing-out of solder on the conductive mounting surface while the transistor is being provided, this conductive mounting surface is provided with a groove in which the transistor is soldered. The conductive mounting surface may then be chosen to be comparatively small, so that the high-frequency properties of the transistor are good.

The known device described has the disadvantage that the high-frequency properties of the transistor are not good enough for some applications. In addition, the known device is difficult to manufacture on account of the groove in the mounting surface.

SUMMARY OF THE INVENTION

According to the invention, the connection pads of the emitter, base, and collector are situated on a second main surface lying opposite the first main surface, and the lateral dimensions of the conductive mounting surface are substantially equal to the dimensions of the first main surface of the transistor.

The connection pad for the collector accordingly lies on the second main surface of the transistor. The conductive mounting surface to which the transistor is applied with its first main surface may then be chosen to be comparatively small. This mounting surface is not used now for providing bonding wires thereon for the connection of the collector. It suffices for this mounting surface to be so large that the transistor can be easily applied thereon, i.e. the lateral dimensions of the conductive mounting surface are approximately equal to the dimensions of the first main surface of the transistor. The lateral dimensions are here understood to be the dimensions in the plane of the surface (perpendicular to a thickness). The high-frequency properties of the transistor are strongly determined by the size of the conductive mounting surface. Given a smaller mounting surface, bonding wires for the connection pads of emitter and base may be made shorter because these wires need not be passed over a comparatively large conductive mounting surface anymore. The self-inductance and series resistance of these wires is reduced thereby. The insulating substrate is mounted on the conductive ground surface. The conductive ground surface together with the insulating substrate and the conductive mounting surface forms a parasitic capacitance which is connected to the bipolar transistor. A smaller mounting surface leads to a lower parasitic capacitance. The parasitic capacitance is especially important for high-frequency applications. Since it is not necessary to make a groove in the substrate for obtaining good high-frequency properties, the semiconductor device is also easier to manufacture than the known device.

Preferably, the substrate is provided with a cavity which continues down to the ground surface, an insulated body being present in the cavity and making contact with the ground surface by a first side, while a second side of the body lying opposite the first side is provided with the mounting surface on which the transistor is arranged, the body comprising a material having a thermal conductivity of more than 10 W/mK. The conductive mounting surface is thus provided on a body of a material which has a comparatively good thermal conductivity and is present in a cavity in the substrate. Heat can then be readily transported from the transistor through the body to the ground surface. The body may comprise a material such as aluminum, copper, diamond, or alumina. Preferably, the body comprises BeO. BeO has a thermal conductivity of approximately 250 W/mK.

The lateral dimensions of the body may be greater than the dimensions of the conductive mounting surface, for example in a direction in which no bonding wires extend.

Preferably, however, the lateral dimensions of the body are substantially equal to the dimensions of the mounting surface, the lateral dimensions of the cavity being such that the body exactly fits therein. Such a device has the advantage that the dimensions of the cavity which traverses the substrate are not greater than is necessary for mounting the body. Problems involving fracture of the substrate are thus prevented, while in addition a smaller body is less expensive.

In an advantageous embodiment, a thickness of the body perpendicular to its lateral dimensions is smaller than a thickness of the insulating substrate. Such a thin substrate provides a better heat removal.

The use of a thin body with a large mounting surface on which bonding wires are applied could give rise to problems in connecting the collector bonding wires to the mounting surface because the mounting surface of a comparatively thin body will lie recessed in the substrate. The bonding wires for the connector may then readily come into contact with edges of the cavity, which could lead to problems, for example during manufacture. Problems could also arise because a bonding machine cannot easily reach the mounting surface in the cavity. In the device according to the invention, the bonding wires are provided on connection pads on the second main surface of the transistor. The second main surface lies much higher than the mounting surface, so that problems in the mounting of bonding wires are absent.

The connection pads of the emitter and collector of the transistor are each connected to further components of the semiconductor device via several bonding wires. The currents in modern bipolar transistors are strong, which means, in combination with high operating frequencies, that the impedance formed by the self-inductance in the emitter bonding wires has a considerable influence on the transistor behavior. The result of this is that, for example in the case of one emitter bonding wire, a negative feedback effect is created, and the high-frequency gain of the transistor is reduced. Several emitter bonding wires lead to a low impedance of the bonding wires and a good high-frequency behavior. The use of several bonding wires for the collector connection achieves that the transistor performance is not adversely affected by an excessive series resistance in the collector connection in the case of comparatively strong currents through the collector. Such bonding wires are applied in such a manner that the bonding wires run parallel.

BRIEF DESCRIPTION OF THE DRAWING

The Figures are purely diagrammatic and not drawn true to scale. Corresponding parts have generally been given the same reference numerals in the Figures.

DETAILED DESCRIPTION OF THE PREFERRED EMBODIMENTS

Figure 1:
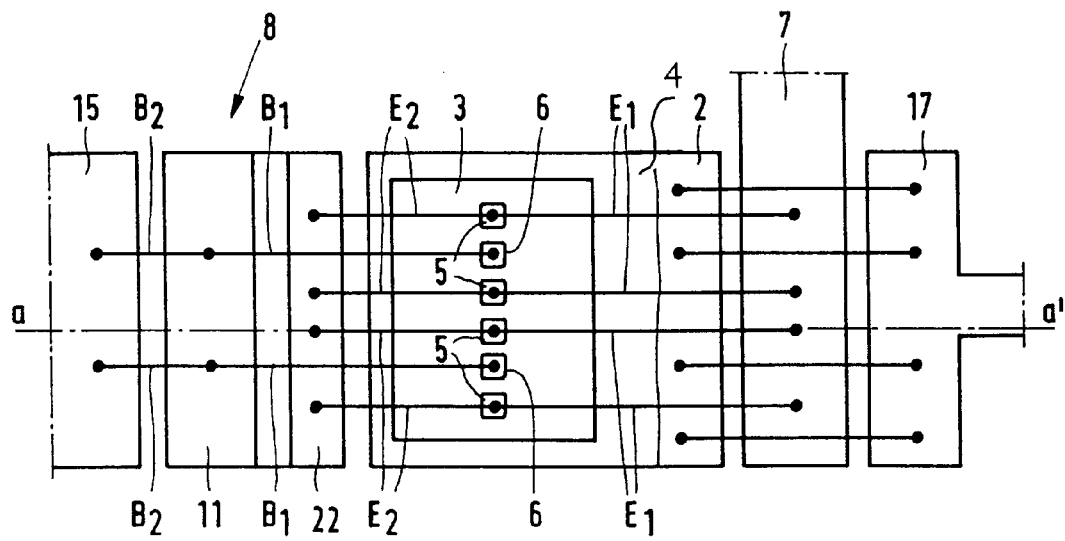
FIG. 1 is a plan view of a known semiconductor device.
Figure 2:
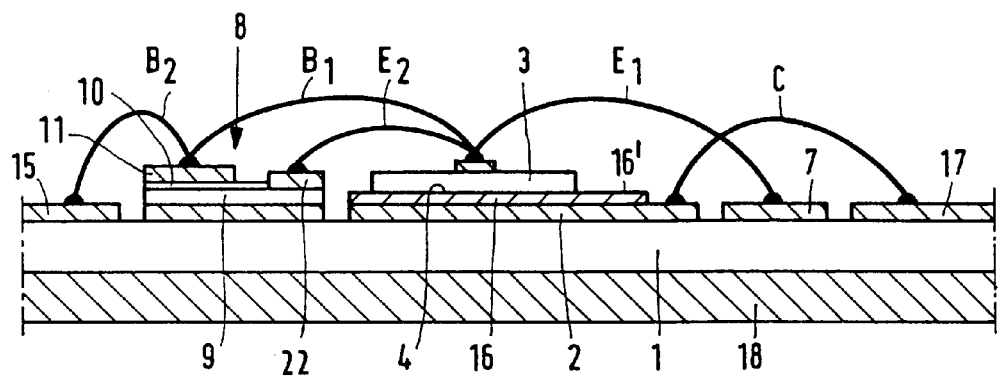
FIG. 2 is a cross-section taken on the line a–a' in FIG. 1 of a known semiconductor device.

FIG. 1 shows a known semiconductor device in plan view and FIG. 2 in cross-section taken on the line a–a', provided with an insulating substrate 1 of $Al_2O_3$ with a conductive mounting surface 2 on which a bipolar transistor 3 is provided with its first main surface 40 in contact with the mounting surface 2. The conductive mounting surface is made of copper. The transistor 3 is provided with connection pads 5, 6, 4 for an emitter, base, and collector. These connection pads in the known semiconductor device are connected to further components through bonding wires E1, E2, B1, B2, and C. FIG. 1 shows how the emitter connection pads 5 are provided in a fourfold arrangement. The emitter connection pads 5 are connected to a conductor track 7 via the bonding wires E1 and to a capacitor 8 via the bonding wires E2. The capacitor in this example comprises a silicon substrate 9 provided with an insulating layer 10. A first electrode 11 of the capacitor 8 is provided on the insulating layer 10. This electrode 11 is connected to the bonding wires B1 and B2. The silicon substrate 9 acts as the second electrode of the capacitor 8. The silicon substrate 9 is connected to a conductive mounting surface 22 on which the bonding wire E2 is provided as a so-called zero-ohmic contact. The base connection pads 6 are provided in a twofold arrangement and are connected to the electrode 11 of the capacitor 8 via bonding wires B1 and are further connected to a conductor track 15 via bonding wires B2. The collector connection pad 4 is present on the first main surface 4 of the transistor 3. The transistor 3 is soldered with its first main surface 4 against the conductive mounting surface 2 by means of a solder layer 16. The conductive mounting surface 2 is much larger than the dimensions of the first main surface 4 of the transistor because solder 16 flows out during the application of the transistor 3 on the conductive mounting surface 2, and a portion 16' of the conductive mounting surface 2 lying outside the portion covered by the transistor 3 becomes covered with solder. A bonding wire C for the collector cannot be reliably fastened to this portion 16' covered with solder. The conductive mounting surface 2 is much larger than the dimensions of the first main surface 4 of the transistor 3 so that a bonding wire for the collector can nevertheless be reliably fastened. The bonding wire C in this example is connected through to the conductor track 17. An alternative known solution is to provide the conductive mounting surface 2 with a groove for preventing flowing-out of the solder. The solder remains in the groove then and the portion 16' is small or absent. The semiconductor device is specially designed for large currents and high operating frequencies, for example above approximately 1 GHz. Several emitter bonding wires E1, E2 provide a low self-inductance of the bonding wires and good high-frequency properties. The use of several bonding wires C for the collector connection achieves that the transistor performance is not adversely affected by an excessively high resistance in the collector connection at comparatively high currents through the collector. The bonding wires are so provided in practice that the bonding wires B1, B2, E1, E2, C run parallel, for reasons of manufacturing technology and also to achieve an optimum space utilization.

Figure 3:
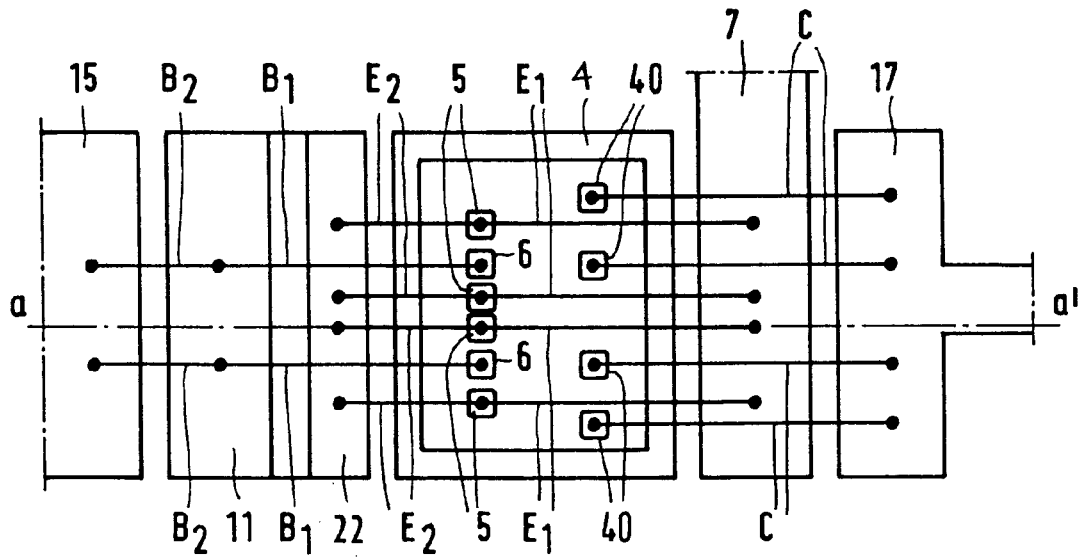
FIG. 3 is a plan view of a first embodiment of the semiconductor device according to the invention.
Figure 4:
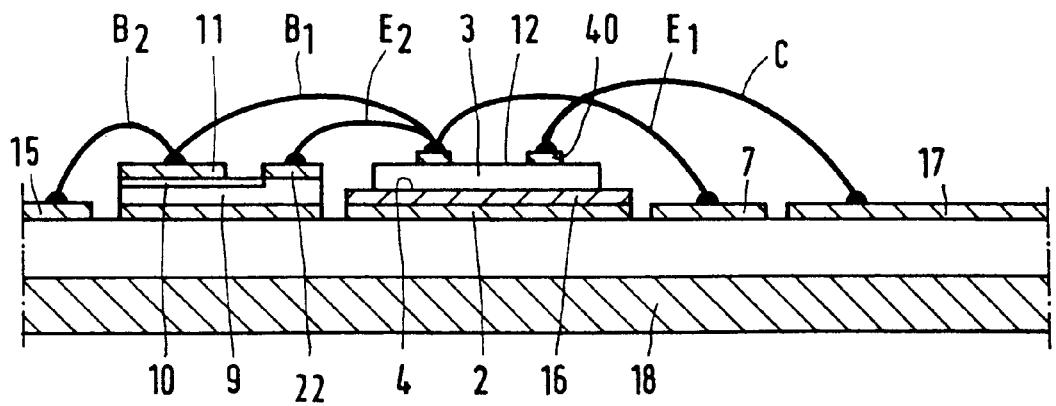
FIG. 4 is a cross-section taken on the line a–a' in FIG. 3 of the semiconductor device according to the invention.

FIGS. 3 and 4 show part of a semiconductor device according to the invention where the connection pads 5 of the emitter, the connection pads 6 of the base, and the connection pads 40 of the collector are situated on a second main surface 12 of the transistor 3 lying opposite the first main surface 4, the dimensions of the conductive mounting surface 2 being substantially equal to the dimensions of the first main surface 4 of the transistor 3. According to the invention, the collector connection pad 40 now lies on the second main surface 12 of the transistor 3. The conductive mounting surface 2 to which the first main surface 4 of the transistor 3 is applied can be chosen to be comparatively small now. This is because no bonding wires C for connecting the collector are provided on this mounting surface 2. It is sufficient when this mounting surface 2 is so large that the transistor 3 can be easily provided thereon, i.e. the dimensions of the conductive mounting surface 2 are approximately equal to the dimensions of the first main surface 4 of the transistor 3. The mounting surface 2 may be taken a little larger than the first main surface 4 in view of, for example, alignment tolerances and inaccuracies in the manufacturing process. The conductive mounting surface 2 in known semiconductor devices is comparatively large compared with the dimensions of the transistor 3 because bonding wires C are provided on the mounting surface 2. The high-frequency properties of the transistor 3 are strongly dependent on the size of the conductive mounting surface 2. The conductive mounting surface 2 in combination with the insulating substrate 1 in fact forms a parasitic capacitance with the conductive ground surface 18 on which the insulating substrate 1 is mounted, in this example a heat sink for draining off heat generated in transistor 3. It is very important, especially for high-frequency applications, that this parasitic capacitance should be kept as small as possible. Furthermore, the bonding wires E1 for the emitter connection pads may also be made shorter because these wires no longer have to be passed over a comparatively large conductive mounting surface 2. The shorter emitter bonding wires provide a lower self-inductance in the emitter bonding wires, and accordingly better high-frequency properties. In this embodiment of the invention, the materials, the connections of the bonding wires, the capacitor 8, and the conductor tracks are identical to those in the known embodiment shown in FIGS. 1 and 2 in all other respects.

Figure 5:
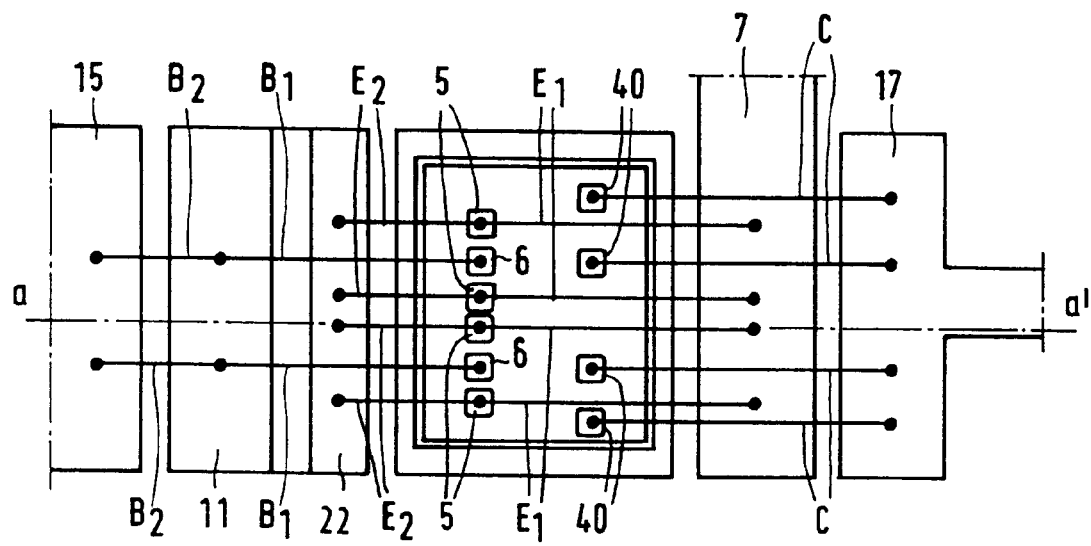
FIG. 5 is a plan view of a second embodiment of the semiconductor device according to the invention.
Figure 6:
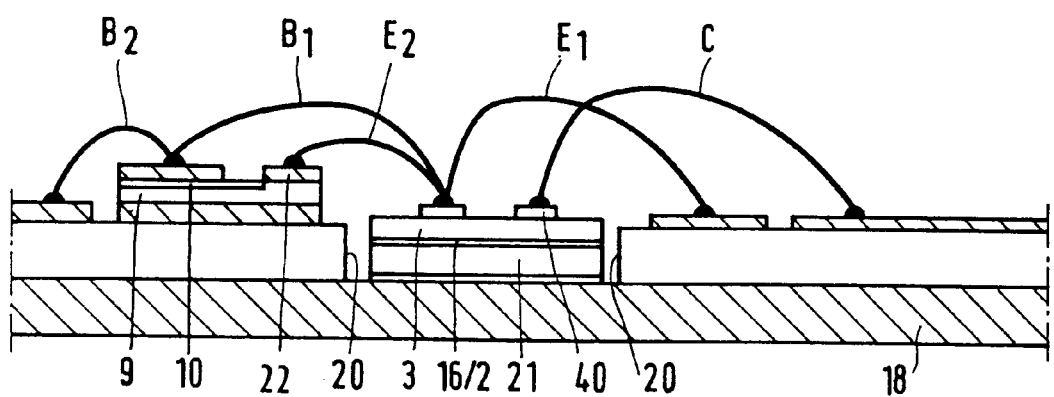
FIG. 6 is a cross-section taken on the line a–a' in FIG. 5 of the semiconductor device according to the invention.

In a second embodiment of the invention as shown in FIGS. 5 and 6, the substrate 1 is provided with a cavity 20 at the area of the conductive mounting surface 2, in which cavity a body 21 with a thermal conductivity of more than 10 W/mK is present, a so-called insert. The transistor 3 is fixed on the body 21 by means of a solder layer 16. The solder layer 16 in this example at the same time constitutes the conductive mounting surface 2. The dimensions of the body 21 correspond to those of the conductive mounting surface 2. The body 21 is provided so as to achieve a better heat removal than in the first embodiment shown in FIGS. 3 and 4 without a body 21. The body 21 is made of BeO in this example. BeO has a thermal conductivity of approximately 250 W/mK. Alternatively, the body may be made from AlN or BN.

The high-frequency transistor 3 according to the invention comprises a semiconductor substrate in which base, emitter, and collector regions are provided in a manner known in IC technology. These regions are provided, for example, in the form of fingers. More details on such a transistor can be found in European Patent Application 96201822.2.

The invention is not limited to the embodiments described above. Several connection pads and bonding wires are used for the base, emitter, and collector in the examples. It will be obvious that other numbers of connection pads, such as single pads or indeed larger numbers of connection pads, are possible within the scope of the invention. It is also possible to make connection pads so large that several bonding wires can be applied to one pad. The transistor 3 in this example is connected by its emitter and base to capacitors. Other configurations are also possible within the scope of the invention. The base, emitter, and collector may thus be connected to resistors, capacitors, inputs or outputs of semiconductor devices such as diodes, transistors, or ICs. The substrate in the embodiments is made from $Al_2O_3$, but it is alternatively possible to manufacture the substrate from other insulating materials such as, for example, AlN.

What is claimed is:

1. A semiconductor device provided with an insulating substrate and a conductive mounting surface, said insulating substrate being provided on a conductive ground surface, while a bipolar transistor is provided on the mounting surface with a first main surface of said transistor in contact with the mounting surface, and the transistor is provided with connection pads for an emitter, base, and collector, on a second main surface lying opposite the first main surface, and the lateral dimensions of the conductive mounting surface are substantially equal to the dimensions of the first main surface of the transistor.

2. A semiconductor device as claimed in claim 1, wherein the substrate is provided with a cavity which continues down to the ground surface, an insulated body being present in said cavity and making contact with the ground surface by a first side, while a second side of said body lying opposite the first side is provided with the mounting surface on which the transistor is arranged, said body comprising a material having a thermal conductivity of more than 10 W/mK.

3. A semiconductor device as claimed in claim 2, wherein the lateral dimensions of the body are substantially equal to the dimensions of the mounting surface, the lateral dimensions of the cavity being such that the body exactly fits therein.

4. A semiconductor device as claimed in claim 2 wherein a thickness of the body perpendicular to its lateral dimensions is smaller than a thickness of the insulating substrate.

5. A semiconductor device comprising
a conductive ground surface,
an insulating substrate provided on said conductive ground surface,
a conductive mounting surface on the insulating substrate, the conductive mounting surface having lateral dimensions,
a bipolar transistor having a first main surface and a second main surface lying opposite the first main surface, the first main surface being in contact with the mounting surface and having lateral dimensions which are substantially equal to the lateral dimensions of the mounting surface, and
connection pads for an emitter, a base, and a collector, the connection pads being situated on the second main surface of the transistor.

* * * * *